(12) United States Patent
Smith et al.

(10) Patent No.: US 7,343,675 B2
(45) Date of Patent: Mar. 18, 2008

(54) METHOD OF CONSTRUCTING A STRUCTURAL CIRCUIT

(75) Inventors: C. W. Sinjin Smith, Palm Bay, FL (US); Paul B. Jaynes, Indialantic, FL (US); Charles J. Newton, Palm Bay, FL (US); Travis L. Kerby, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 413 days.

(21) Appl. No.: 10/987,285

(22) Filed: Nov. 12, 2004

(65) Prior Publication Data

US 2006/0104037 A1    May 18, 2006

(51) Int. Cl.
*H01K 3/22* (2006.01)

(52) U.S. Cl. ............... 29/848; 29/830; 29/831; 29/832; 29/842; 156/234; 156/238; 156/247; 156/344; 257/E21.499; 257/E23.181; 428/1.1; 428/1.2

(58) Field of Classification Search ............ 29/848, 29/842, 830–832; 156/234, 238, 247, 344; 257/E21.499, E23.181; 428/1.1, 1.2
See application file for complete search history.

(56) References Cited

U.S. PATENT DOCUMENTS

| | | | |
|---|---|---|---|
| 5,184,141 A | 2/1993 | Connolly et al. | |
| 5,827,999 A | 10/1998 | McMillan et al. | |
| 6,320,257 B1 | 11/2001 | Jayaraj et al. | |
| 6,329,603 B1 | 12/2001 | Japp et al. | |
| 6,334,922 B1 * | 1/2002 | Tanaka et al. | 156/234 |
| 6,696,163 B2 | 2/2004 | Yang | |
| 6,977,187 B2 * | 12/2005 | Farrell et al. | 438/106 |
| 2003/0207048 A1 | 11/2003 | St. Lawrence et al. | |
| 2004/0010910 A1 | 1/2004 | Farrell et al. | |
| 2004/0012083 A1 | 1/2004 | Farrell et al. | |

OTHER PUBLICATIONS

Hayden, Terry F., Dr., "New Liquid Crystal Polymer (LCP) Flex Circuits to Meet Demanding Reliability and End-Use Applications Requirements" 3M Microelectronics Systems Division, Austin, TX.
Yang, Rui. "A flex circuit substrate option". [online] [retrieved on Jul. 27, 2004]. Retrieved from the Internet:<URL:http//ap.pennent.com/Articles/Article_Display.cfm?Section=Articles &Subsection=Displa . . . .
Tech-Etch. "Flexible Circuits on LCP Substrates". [online] [retrieved on Jul. 27, 2004]. Retrieved from the Internet <URL:hppt://www.tech-etch.com/flex/pro3.html>.
Hayden, T., "New Liquid Crystal Polymer (LCD) Flex Circuits to Meet Demanding Reliability and End-Use Applications Requirements" 3M Microelectronics Systems Division, Austin, TX. Presented at the International Conference on Advanced Packaging and Systems, Mar. 2002.

* cited by examiner

*Primary Examiner*—Tim Phan
(74) *Attorney, Agent, or Firm*—Darby & Darby; Robert J Sacco

(57) ABSTRACT

A method relating to a multi-functional, structural circuit, referred to as a structural circuit, is disclosed. The method can include thermoforming a liquid crystal polymer (LCP) circuit with a structural element (215). At least one circuit component can be attached to the surface of the LCP circuit (220).

18 Claims, 4 Drawing Sheets

METHOD OF CONSTRUCTING A STRUCTURAL CIRCUIT

BACKGROUND OF THE INVENTION

1. Statement of the Technical Field

The present invention relates generally to circuits that can be physically integrated with elements of structure.

2. Description of the Related Art

Conventional printed circuit board (PCB) technology has been used extensively in designing complex circuitry. PCB's can be manufactured in a variety of two-dimensional planar shapes. Typically, PCB circuitry is incorporated into a system by mounting one or more rigid PCB's to a structure using some sort of mechanical fastener. This method of attaching circuitry to structure can be problematic, particularly when the space available for housing such circuitry is small or awkwardly shaped.

The development of flexible circuits has provided designers with an alternative to PCB circuit construction. A flexible circuit, as its name implies, is not rigid. Rather, thermoplastic, or a thermoset polymer (polyamide), is used as a base material upon which conductors can be etched. Flexible circuitry, because of its inherent ability to bend, can be used in a larger number of environments and spaces than rigid PCB circuitry.

One variety of flexible thermoplastic circuit is the liquid crystal polymer (LCP) film circuit. LCP circuits are constructed using LCP as a substrate. LCP is a type of thermoplastic aromatic polyester that offers several advantages, particularly with respect to traditional polyimide film circuits. For example, LCP circuits exhibit beneficial electrical properties such as a low dielectric constant which facilitates faster electrical signal transfer. Additionally, LCP has very low moisture absorption, typically on the order of 0.02%. Low moisture absorption also facilitates stable high frequency signal and data processing, allowing LCP circuits to be used at frequencies in and around 40 GHz. Accordingly, LCP circuits are suited to a variety of different applications including, but not limited to, high frequency microminiaturization, sensors, antennas, and high speed flip-chip designs.

To date, flexible circuits have been attached to structures using adhesives. The use of adhesives, however, is less than ideal. In particular, if the structural element to which the flexible circuit is attached is subjected to stress, a portion, or all, of the flexible circuit may become detached from the structural element. Further, such configurations typically do not contribute to the overall strength of the structural element to which the flexible circuit is attached. Such is the case as the flexible circuit and the structural element, despite the use of an adhesive, still are essentially separate and distinct components.

SUMMARY OF THE INVENTION

The invention concerns a method and apparatus relating to a multi-functional, structural circuit, referred to as a structural circuit. One aspect of the present invention can include a method of constructing a structural circuit. The method can include thermoforming a liquid crystal polymer (LCP) circuit with a structural element. In one embodiment, the LCP circuit can be a flexible LCP film circuit. Heat and pressure can be applied to the LCP circuit and structural element, thereby causing the LCP circuit to flow into the structural element. The term "flow" refers to a relaxation of a material as the material approaches its glass transition temperature ($T_g$) such that the material can be pressed to mechanically bond to another surface.

The structural element can be any of a variety of different materials including, but not limited to, carbon fiber cloth or LCP material. In the case where the structural element is LCP material, the structural element can be formed into a particular shape prior to thermoforming the LCP circuit with the structural element. Notably, the LCP material can be formed through thermoforming and/or injection molding. In any case, one or more conductors can be created on the LCP circuit prior to thermoforming the LCP circuit with the structural element.

One or more circuit components can be attached to a surface of the LCP circuit after thermoforming with the structural element. Additionally, a cover layer can be applied atop of at least portion of the surface of the LCP circuit. The cover layer, for example a LCP film, can be applied by thermoforming the cover layer to the LCP circuit and/or the structural element.

Another aspect of the present invention can include a method for integrating an electronic circuit into a structural member. The method can include selecting a structural element having any, or a particular, surface contour and integrally forming an electronic circuit together with the structural element to define at least a portion of the surface contour. The method further can include attaching at least one circuit component to a surface of the electronic circuit.

In one embodiment of the invention, the electronic circuit can be a flexible LCP film circuit. The step of integrally forming the electronic circuit with the structural element can include thermoforming the two together. The method also can include applying a cover layer to at least a portion of the surface of the electronic circuit.

The structural element can include, but is not limited to, LCP material or carbon fiber cloth. In the case where the structural element is carbon fiber cloth, the method can include impregnating at least a portion of the structural element with flowable resin. For example, the structural element can be impregnated with flowable resin in portions that are unoccupied by the electronic circuit.

Another aspect of the present invention can include a structural circuit apparatus. The structural circuit can include a structural element and at least one LCP circuit. The structural element and the LCP circuit are thermoformed together forming a single composite structure. As noted, the one or more LCP circuits can be flexible LCP film circuits. Also, the structural element can be any of a variety of materials including, but not limited to, carbon fiber cloth or LCP material. In the case of a structural element made of LCP material, the structural element can be formed into a particular shape prior to being thermoformed with the LCP circuit.

The structural circuit also can include one or more circuit components which are mounted to a surface of the LCP circuit. The circuit components can be mounted after thermoforming the LCP circuit and the structural element together. A cover layer can be included in the structural circuit as well. The cover layer can be disposed atop of at least a portion of a surface of the LCP circuit. Notably, the cover layer, which can be a LCP film, can be thermoformed to the LCP circuit and/or the structural element.

DETAILED DESCRIPTION OF THE PREFERRED EMBODIMENTS

The present invention relates to multi-functional structural circuits. Generally, a multi-functional structural circuit, referred to as a structural circuit, is a circuit that serves both a structural function and an electronic or circuit-related function. That is, a structural circuit can be a fully functioning circuit, or portion of a larger circuit. A structural circuit, in contrast to conventional circuits which are attached to structure using mechanical fasteners or adhesives, is physically integrated with structure.

In one aspect of the present invention, a structural circuit can be implemented using a liquid crystal polymer (LCP) circuit, such as a flexible LCP film circuit. As noted, LCP is a type of thermoplastic that can be manufactured into a flexible, thin film and used as a substrate for constructing a circuit. Such material is commercially available from Rogers Corporation, of Rogers, Conn. Rogers Corporation manufactures LCP circuit material and markets it under its R/FLEX® line of products.

LCP circuits typically have a thin layer of tinned copper that is mechanically bonded to the LCP film substrate. Conductors can be formed through etching, as is the case with conventional PCB designs. Circuit components can be added to the LCP film substrate using conventional surface mount technologies. Notably, one or more LCP films can be combined to form a multi-layer circuit.

In accordance with the inventive arrangements disclosed herein, a structural circuit can be formed by physically integrating an LCP circuit with a structural element. By physically integrating the LCP circuit and the structural element, a single composite structure is formed. As used herein, a structural element can include, but is not limited to, a load-bearing element, such as a portion of an inner-frame or a support member of a structure. Alternatively, a structural element can be an outer covering, sheeting, or skin of a structure, such as the outer portion of a body of an automobile or aircraft. In general, a structural element can be any portion of a structure.

A structure, as used herein, can be any object having one or more components. For example, a structure can be a building, a vehicle such as an aircraft, automobile, or water vessel, machinery, a system such as a personal computer or personal digital assistant, or the like. In any case, it should be appreciated that the examples disclosed herein are not intended as a comprehensive listing of possible structures or structural elements. As such, the present invention should not be limited by the material of the structural element or structure within which the structural element can be disposed.

Figure 1A:
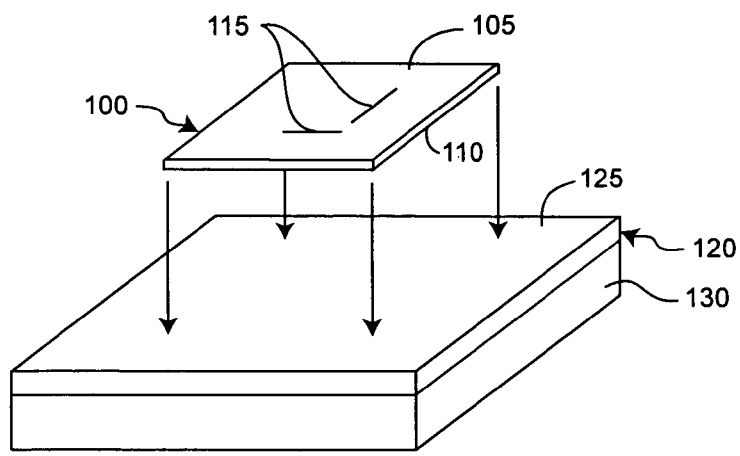
FIGS. 1A, 1B, and 1C are perspective views illustrating the formation of a structural circuit in accordance with one embodiment of the present invention.
Figure 1B:
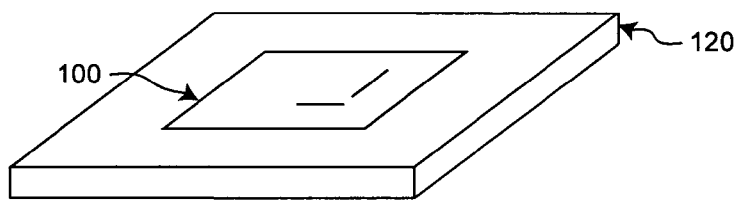
Figure 1C:
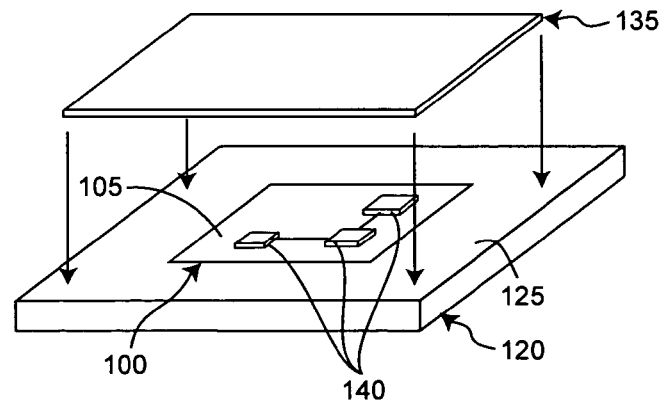

FIGS. 1A, 1B, and 1C are perspective views illustrating the formation of a structural circuit in accordance with one embodiment of the present invention. FIGS. 1A-1C, taken together, illustrate an embodiment of the present invention where a LCP circuit 100 is incorporated with a structural element 120. Referring to FIG. 1A, the LCP circuit 100, as disclosed herein, can be a flexible LCP circuit having a LCP film substrate with one or more conductors 115 disposed on surface 105. As noted, the conductors 115 can be formed through etching, as is the case with conventional PCB designs.

It should be appreciated that other structures, such as pads, through holes, voids, or other conductive paths for connecting layers of a multi-layer LCP circuit also can be included as part of LCP circuit 100. These circuit structures can be formed using any of a variety of techniques which are known to be effective with LCP circuits. Such techniques can include, but are not limited to, chemical etching, vacuum metallization, additive plating, mechanical drilling, laser ablation, plasma drilling, and the like.

The structural element 120 can be a discrete component, or portion of a component. For example, in one embodiment, the structural element 120 can be a carbon fiber cloth. In another embodiment, the structural element 120 can be LCP that is, or can be, formed or shaped as needed. In that case, the LCP material can be LCP resin having glass particles mixed therein to facilitate rigidity. Such material can be thermoformed or injection molded into a particular shape and then integrated with LCP circuit 100 as described herein.

Prior to applying any surface mounted components, whether electrical, optical, electro-optical, integrated circuits, and/or discrete components, the LCP circuit 100 can be bonded to the structural element 120. The LCP circuit 100 has a top surface 105 to which surface-mount circuit components can be attached and a bottom surface 110. As shown, the bottom surface 110 of the LCP circuit 100, which remains free of surface mount components, can be placed in contact with a top surface 125 of the structural element 120.

If required, a mold 130 also can be used. The mold 130, while depicted as a substantially flat square, can have any of a variety of different shapes and/or contours. Thus, if the structural element 120 is soft or flexible, shaping can be provided by the mold 130. In the case where LCP material has been pre-formed as the structural element 120, the mold 130 can provide added support to prevent deformation of the structural element 120 when the LCP circuit 100 is bonded thereto.

FIG. 1B depicts the LCP circuit 100 after being integrated with the structural element 120. To integrate the LCP circuit 100 with the structural element 120, the two are thermoformed together. Generally, thermoforming is a process for forming plastics, such as a LCP film, into a three-dimensional shape through the application of heat and pressure. In this case, thermoforming is used to bond the LCP circuit 100 and the structural element 120 together as a single, composite structure.

During the thermoforming process, the entire LCP circuit 100 is heated it until it softens or is flowable. The term "flow" refers to a relaxation of a material as the material approaches its glass transition temperature ($T_g$) such that the material can be pressed to create a mechanical bond with another surface. The LCP circuit 100 enters this pseudo-fluidic state at a temperature of approximately 280°-325° C. While in this pseudo-fluidic state, pressure and/or a vacuum can be applied to flow the LCP circuit 100 into the structural element 120. In one embodiment, approximately 100-200 PSI can be applied to cause the LCP circuit 100 to bond to the structural element 120. Notably, in the case where the structural element 120 is LCP material, the structural element 120 also can be placed into a pseudo-fluidic state such that the LCP material of the structural element 120 also is able to flow into the LCP circuit 100.

The LCP circuit 100 essentially becomes physically integrated with, or bonded to, the structural element 120, thereby forming a single composite structure. The amount of time required to thermoform the LCP circuit 100 to the structural element 120 will vary with the material with which the structural element 120 is made, the mass of the LCP circuit 100, as well as the amount of copper in the LCP circuit 100. An autoclave, or other suitable machinery, can be used to thermoform the LCP circuit 100 and the structural element 120. For example, in the case of a multi-layer LCP circuit, the hold temperature can be about 285° to 315° C. and the hold pressure can be on the order of about 8-20 minutes at about 100 to 200 P.S.I. In the case of injection molding, the dwell time in the mold need only be about 1 to 10 seconds.

In the case where carbon fiber cloth is the structural element 120, the LCP circuit 100 can be made to flow onto the carbon fiber cloth. The carbon fiber cloth is placed atop of a mold, such as mold 130, so that as the LCP circuit 100 flows into the carbon fiber cloth, the two take on the shape of the mold. Notably, the LCP circuit 100 need not occupy the entire surface area of the carbon fiber cloth or structural element. In that case, the portion of the carbon fiber cloth with which the LCP circuit 100 has been integrated can take on the shape of the mold 130 with a degree of rigidity. The portions of the carbon fiber cloth that are not occupied by the LCP circuit 100 can remain flexible. While thin LCP circuits will maintain flexibility, the joined portions of carbon fiber cloth and LCP may be less flexible than each individual component.

Still, once the LCP circuit 100 is integrated with the carbon fiber cloth, further processing can be performed. For example, the resulting composite structure can be impregnated with flowable resin such as an epoxy resin and further formed into a desired shape or contour that may be used within a larger structure. Notably, the flowable resin can be flowed into the entire carbon fiber cloth and/or flowed into only a portion of the carbon fiber cloth. In one embodiment, the flowable resin can be introduced only into those portions of the carbon fiber cloth that are not occupied by the LCP circuit 100.

It should be appreciated that the materials provided as examples of structural elements are not intended to be limitations on the present invention. Rather, any of a variety of different materials can be used as the structural element 120. More particularly, any material to which the LCP circuit 100 can be thermoformed as described herein can be used as the structural element. Other structural materials can include, but are not limited to, aluminum, low temperature co-fired ceramic (LTCC), fiberglass, Aramid fibers, and the like.

Regarding FIG. 1C, once the LCP circuit 100 has been physically integrated with the structural element 120, the LCP circuit 100 can be populated with one or more circuit components 140. More particularly, electrical, optical, electro-optical, integrated circuits, and/or discrete components can be added to the top surface 105 of the LCP circuit 100 once it has been applied to the surface 125 of the structural element 120. Such circuit components 140 can be mounted after the LCP circuit 100 has been thermoformed to the structural element 120 using surface mount technology. For example, in one embodiment, the resulting composite structure can be reflow soldered at a temperature of approximately 230°-240° F.

After the circuit components 140 have been mounted to the LCP circuit 100, an optional, protective cover layer 135 can be added to the top surface 105. The cover layer serves to further protect the LCP circuit from moisture and other agents. In one embodiment of the present invention, the cover layer 135 can be an additional LCP film. Such a cover layer can be thermoformed to the LCP circuit 100, thereby hermetically sealing the LCP circuit 100 and the components 140. As shown, the cover layer 135 may extend beyond the edges of the LCP circuit 100 if desired. Still, the cover layer 135 also can be shaped to cover a selected portion of the surface 105 of the LCP circuit 100.

Figure 2:
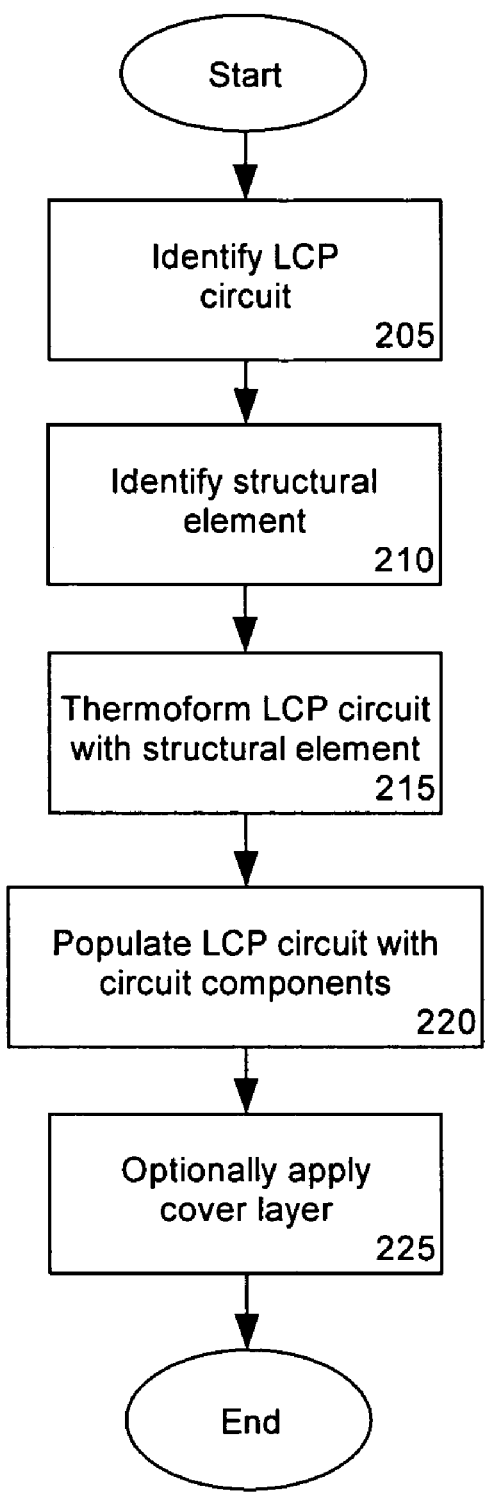
FIG. 2 is a flow chart illustrating a method of constructing a structural circuit in accordance with another embodiment of the present invention.

FIG. 2 is a flow chart illustrating a method of constructing a structural circuit in accordance with another embodiment of the present invention. The method can begin in step 205 where a LCP circuit can be obtained or identified. As noted, the LCP circuit can be etched to include conductors and various other circuit structures. In step 210, a structural element can be identified. As noted, a structural element can be a discrete component of a system or a portion of a discrete component. For example, the structural element can be a piece of carbon fiber cloth, a LCP material, or another material suitable for thermoforming with the LCP circuit.

In any case, in step 215, the LCP circuit can be thermoformed to the structural element. Once thermoformed, the LCP circuit and the structural element can be viewed as a single, composite structure. In step 220, the LCP circuit, being bonded to the structural element, can be populated with circuit components. One or more circuit components can be mounted to the top surface of the LCP circuit using known surface mount techniques.

In step 225, a cover layer optionally can be bonded to the LCP circuit. The cover layer, being added after the circuit components have been populated, serves to further protect the LCP circuit from moisture. In one embodiment of the present invention, the protective layer can be an additional LCP film. The LCP film can be thermoformed to the LCP circuit thereby hermetically sealing the LCP circuit and circuit components.

Notably, while the method disclosed herein indicates that individual LCP circuits are integrated with a structural element, a plurality of individual LCP circuits can be integrated to a single structural element if necessary. Such LCP circuits can be communicatively linked to one another and/or other systems as needed. Such embodiments are contemplated by the present invention.

Figure 3A:
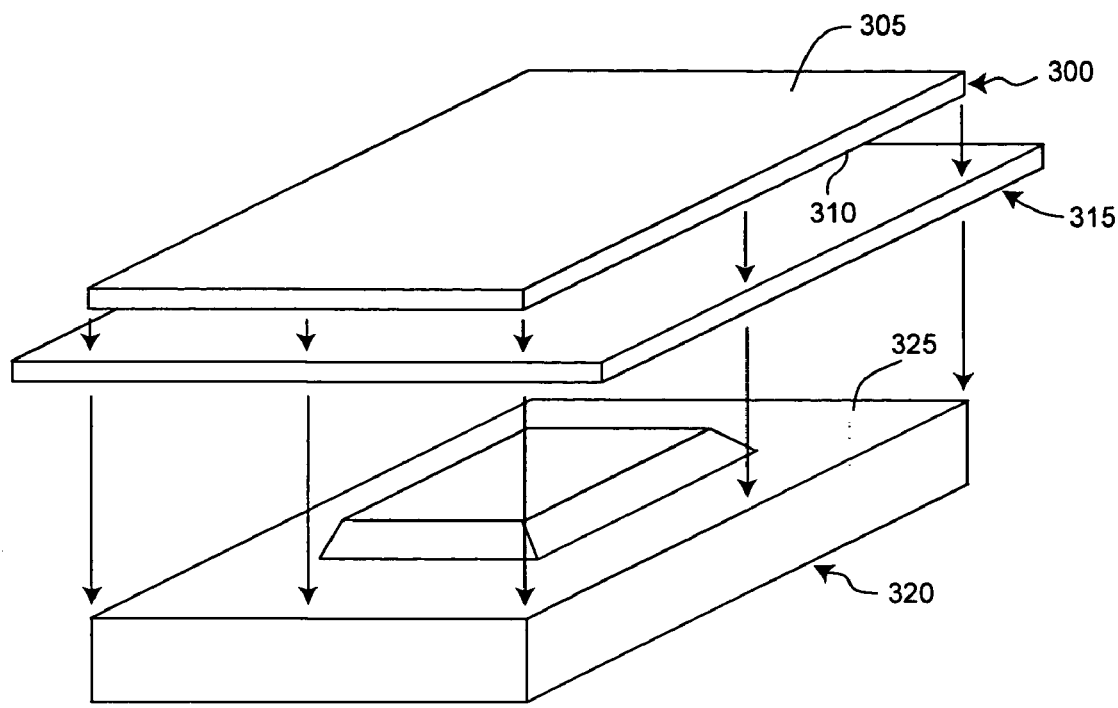
FIGS. 3A and 3B are perspective views illustrating the formation of a structural circuit in accordance with another embodiment of the present invention.
Figure 3B:
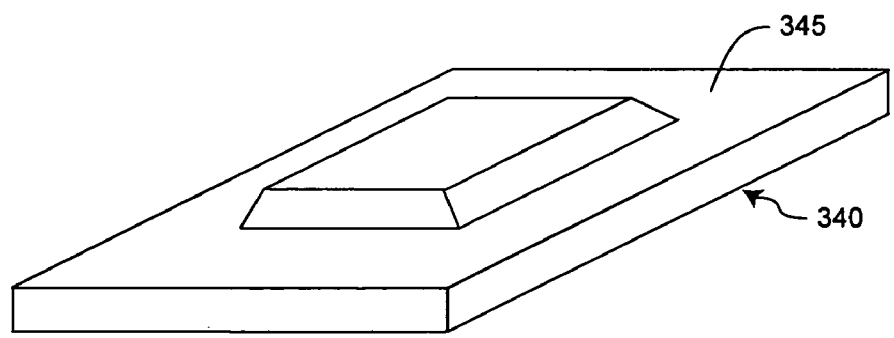

FIGS. 3A and 3B are perspective views illustrating the formation of a structural circuit in accordance with another embodiment of the present invention. FIGS. 3A and 3B, taken together, illustrate an embodiment of the present invention where a LCP circuit 300 is integrally formed with a structural element 315. The LCP circuit 300, as was the case with regard to FIG. 1, can include one or more conductors, structures, and/or other components integrated with the LCP film substrate as the case may be.

The LCP circuit 300 can have a top portion 305 and a bottom portion 310. The LCP circuit 300 can be formed using a mold 320 having a top 325. It should be appreciated that the mold 320 can be fashioned in any of a variety of different shapes or contours. For example, the mold 320 can be shaped in accordance with a desired form of a component of a system or other structure. Using the mold 320, the LCP circuit 300 can be integrated with the structural element 315, for example carbon fiber cloth, such that the resulting composite structure retains the shape or contour of the mold 320. Accordingly, the LCP circuit can define at least a portion of the surface contour of the resulting structural element after the two are integrated.

As noted, the LCP circuit 300 and the structural element 315 can be integrated through a process such as thermoforming. Accordingly, FIG. 3B illustrates the resulting structural LCP circuit 340 after thermoforming, which is a composite of the LCP circuit 300 and structural element 315 of FIG. 3A. The formed LCP circuit 340 takes on the shape or geometry of the surface of the mold to which the LCP circuit was thermoformed, in this case the top. Notably, the formed LCP circuit 340 retains this shape after cooling as well as a degree of rigidity. Once the LCP circuit 340 has been thermoformed, circuit components can be mounted or attached to a top 345. Additionally, if desired, a cover layer can be bonded to the top 345.

Figure 4A:
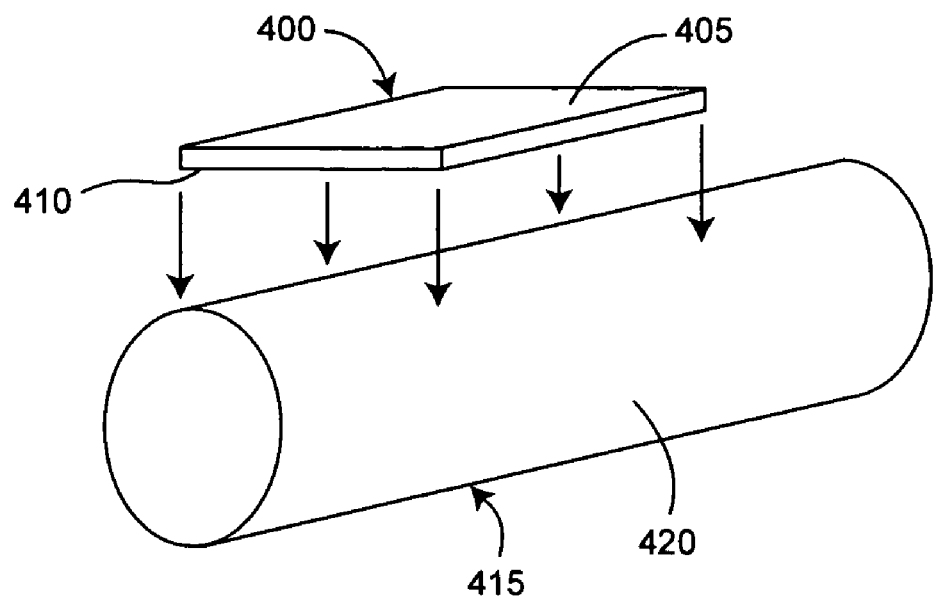
FIGS. 4A and 4B are perspective views illustrating the formation of a structural circuit in accordance with yet another embodiment of the present invention.
Figure 4B:
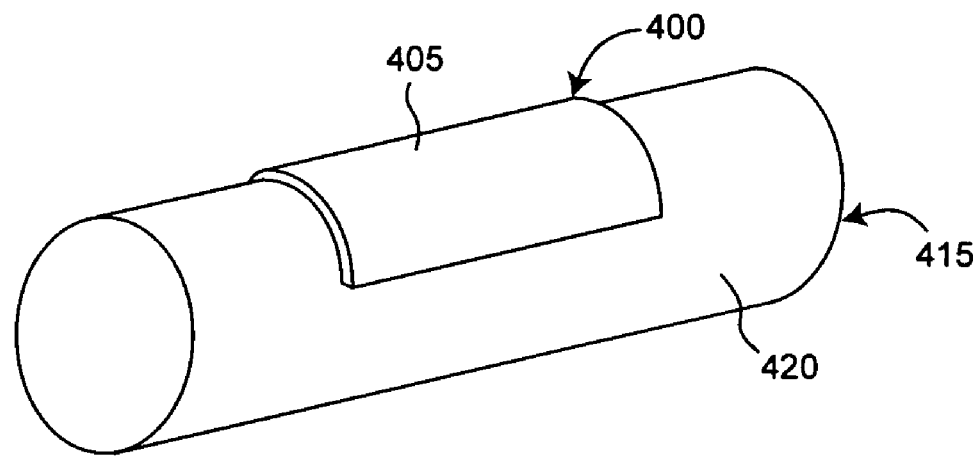

FIGS. 4A and 4B are perspective views illustrating the formation of a structural circuit in accordance with yet another embodiment of the present invention. As shown in FIG. 4A, an LCP circuit 400 can be integrated with a structural element 415. The LCP circuit 405 can be integrally formed with the structural element 415. The LCP circuit 400 has a top 405 to which surface-mount circuit components can be attached and a bottom 410. As shown, the bottom 410 of the LCP circuit 400 can be placed in contact with the outer surface 420 of the structural element 415, for example a pre-formed piece of LCP material.

FIG. 4B depicts the LCP circuit 400 after integration with the structural element 415. Notably, once integrated, the LCP circuit 400 assumes the shape or geometry of the outer surface 410 of the structural element 415, forming a composite structure. It should be appreciated that the resulting composite structure of the LCP circuit 400 and structural element 415 can have any of a variety of different shapes, whether rounded, rippled, concave, convex, square, or another custom shape. Once the LCP circuit 100 has been applied to the structural element 415, the LCP circuit 400 can be populated with one or more circuit components. Accordingly, the LCP circuit 400 defines at least a portion of the outer surface 420 of the structural element 415. Still, it should be appreciated that LCP circuits also can be applied to inner surfaces of structural elements as the case may be.

The inventive arrangements disclosed herein allow circuits to be integrated within structural components or elements. As such, circuitry can be physically integrated with load bearing elements, coverings, or other elements of larger structures and/or systems. In accordance with the inventive arrangements disclosed herein, the structural components are reinforced and strengthened through the integration of LCP circuits. Moreover, the systems which incorporate structural circuits benefit from reduced weight and volume. The present invention also eliminates the need for circuit attachment hardware and/or adhesives.

This invention can be embodied in other forms without departing from the spirit or essential attributes thereof. Accordingly, reference should be made to the following claims, rather than to the foregoing specification, as indicating the scope of the invention.

We claim:

1. A method of constructing a structural circuit comprising:
    forming a liquid crystal polymer (LCP) circuit to perform a function;
    forming a structural element which is designed to function as at least a portion of a load bearing frame member of a structure, in addition to any function associated with said LCP circuit;
    thermoforming said LCP circuit with the structural element; and
    attaching at least one circuit component to a surface of the LCP circuit.

2. The method of claim 1, wherein the LCP circuit is a flexible LCP film circuit.

3. The method of claim 1, further comprising creating at least one conductor on the LCP circuit prior to said thermoforming step.

4. The method of claim 1, said thermoforming step comprising applying heat and pressure to the LCP circuit and structural element, thereby causing the LCP circuit to flow into the structural element.

5. The method of claim 1, wherein the structural element is LCP material.

6. The method of claim 5, further comprising, prior to thermoforming the LCP circuit and the structural element, first forming the LCP material into a particular shape.

7. The method of claim 6, said step of first forming the LCP material comprising thermoforming or injection molding the LCP material.

8. The method of claim 1, wherein the structural element is carbon fiber cloth.

9. The method of claim 1, further comprising applying a cover layer to at least a portion of a surface of the LCP circuit.

10. The method of claim 9, said applying step comprising thermoforming the cover layer to the at least a portion of the surface of the LCP circuit.

11. The method of claim 9, wherein the cover layer is a LCP film.

12. The method according to claim 1, further comprising the step of integrating said structural circuit in said structure; and
    using said structural circuit to perform a mechanical function as part of said structure in addition to any function associated with said LCP circuit.

13. A method of constructing a structural circuit comprising:
    forming a structural element with a material and a surface contour;
    thermoforming a liquid crystal polymer (LCP) circuit with said structural element;
    attaching at least one circuit component to a surface of the LCP circuit; and
    selecting said material and said surface contour to perform a mechanical function with said structural element which is in addition to any function associated with a function of said LCP circuit.

14. The method of claim 13, wherein the LCP circuit is a flexible LCP film circuit.

15. The method of claim 13, further comprising creating at least one conductor on the LCP circuit prior to said thermoforming step.

16. The method of claim 13, said thermoforming step comprising applying heat and pressure to the LCP circuit and structural element, thereby causing the LCP circuit to flow into the structural element.

17. The method of claim 13, wherein the structural element is LCP material.

18. The method of claim 13, wherein the structural element is carbon fiber cloth.

* * * * *